(12) United States Patent
Olsson et al.

(10) Patent No.: US 7,715,515 B2
(45) Date of Patent: May 11, 2010

(54) METHOD AND APPARATUS FOR REDUCING NON-MONTONIC REGIONS IN A DIGITALLY CONTROLLED OSCILLATOR

(75) Inventors: Thomas Olsson, Karlshamn (SE); Roland Strandberg, Malmö (SE); Jim Svensson, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 874 days.

(21) Appl. No.: 11/550,907

(22) Filed: Oct. 19, 2006

(65) Prior Publication Data
US 2008/0094147 A1 Apr. 24, 2008

(51) Int. Cl.
*H03D 3/24* (2006.01)
(52) U.S. Cl. .................. 375/376; 375/371; 375/373; 375/375; 455/75; 455/76; 331/1 R; 331/34; 331/1 A
(58) Field of Classification Search ............ 375/371, 375/376, 375, 373; 455/75, 76; 331/1 R, 331/34, 1 A
See application file for complete search history.

(56) References Cited

U.S. PATENT DOCUMENTS

| 5,347,234 | A | 9/1994 | Gersbach et al. |
| 5,739,725 | A | 4/1998 | Ferraiolo et al. |
| 6,545,545 | B1 | 4/2003 | Fernandez-Texon |
| 6,674,395 | B2 | 1/2004 | Nakanishi et al. |
| 6,961,013 | B2 | 11/2005 | Lin et al. |
| 7,006,589 | B2 * | 2/2006 | Staszewski et al. ......... 375/371 |
| 2003/0099319 | A1 | 5/2003 | Bailey |
| 2003/0206070 | A1 | 11/2003 | Pietruszynski et al. |
| 2008/0132178 | A1 * | 6/2008 | Chatterjee et al. ............. 455/75 |

FOREIGN PATENT DOCUMENTS

JP 3014318 1/1991

OTHER PUBLICATIONS

Guo, Jianjun et al. "Digital Calibration for Monotonic Pipelined A/D Converters." IEEE Transactions on Instrumentation and Measurement, Dec. 2004, pp. 1485-1492, vol. 53, No. 6.
Lee, See Taur et al. "A Quad-Band GSM-GPRS Transmitter with Digital Auto-Calibration." IEEE Journal of Solid-State Circuits, Dec. 2004, pp. 2200-2214, vol. 39, No. 12.

(Continued)

*Primary Examiner*—Phuong Phu
(74) *Attorney, Agent, or Firm*—Coats & Bennett, P.L.L.C.

(57) ABSTRACT

The control word input to a Digitally Controlled Oscillator (DCO) is modified to reduce non-monotonic regions in the output response of the DCO. The DCO may be included in a Phase-Locked Loop (PLL) circuit for generating an output signal that locks onto either the phase or frequency of a reference signal input. By modifying the control word input to the DCO to avoid non-monotonic regions in the DCO output response, PLL phase noise is reduced. In one embodiment, the control word is modified by reordering or skipping control word values input to the DCO that correspond to non-monotonic regions in the output response of the DCO circuit.

28 Claims, 8 Drawing Sheets

OTHER PUBLICATIONS

Lin, Jerry (Heng-Chih). "A Low-Phase-Noise 0.004-ppm/Step DCXO with Guaranteed Monotonicity in the 90-nm CMOS Process." IEEE Journal of Solid-State Circuits, Dec. 2005, pp. 2724-2734, vol. 40, No. 12.

Staszweski, Robert B. et al. "Just-in-Time Gain Estimation of an RF Digitally-Controlled Oscillator for Digital Direct Frequency Modulation." IEEE Transactions on Circuits and Systems-II: Analog and Digital Signal Processing, Nov. 2003, pp. 887-892, vol. 50, No. 11.

Chen, R.Y. et al. "Clock Power Issued in System-on-a-Chip Designs." In Proceedings of the IEEE Computer Society Workshop on VLSI'99, 1999, pp. 48-53.

Olsson, Thomas et al. "A Digitally Controlled PLL for SoC Applications." IEEE Journal of Solid-State Circuits, May 2004, pp. 751-760, vol. 39, No. 5.

Dunning et al., "An All-Digital Phase-Locked Loop with 50-Cycle Lock Time Suitable for High-Performance Microprocessors," IEEE Journal of Solid-State Circuits, Apr. 1995, pp. 412-422, vol. 30, No. 4, XP-000506445.

* cited by examiner

| W  | 0 | 1 | 2 | 3 | 4 | 5 | 6  | 7  | 8  | 9  | 10 | 11 | 12 | 13 | 14 | 15 |
|----|---|---|---|---|---|---|----|----|----|----|----|----|----|----|----|----|
| W' | 0 | 1 | 2 | 5 | 6 | 9 | 10 | 13 | 14 | 15 | 15 | 15 | 15 | 15 | 15 | 15 |

METHOD AND APPARATUS FOR REDUCING NON-MONTONIC REGIONS IN A DIGITALLY CONTROLLED OSCILLATOR

BACKGROUND

The present invention generally relates to digitally controlled oscillators (DCOs), and particularly relates to reducing non-monotonic regions in the output response of a DCO.

A DCO generates an output response corresponding to a digital control word input. Ideally, the output response of a DCO monotonically changes in response to a corresponding monotonically changing digital control word input. However, process variations and other anomalies may cause non-monotonic regions in the output response of a conventional DCO. When a DCO operates in a non-monotonic region, its output response does not monotonically increase/decrease in response to a corresponding monotonically increasing/decreasing control word. Instead, breaks occur in the DCO output response. These breaks may cause duplicative regions in the DCO output response, i.e., regions in the DCO output response where different control word values produce the same or nearly the same output response. Duplicative regions in the DCO output response may cause errors or other problems in certain applications.

For example, a DCO conventionally forms an integral part of a Phase-Locked Loop (PLL). When included in a PLL, a DCO is the mechanism by which the PLL adjusts its output phase or frequency. In operation, a PLL attempts to 'lock' onto or synchronize itself with an input reference signal. Particularly, a phase detector determines the phase difference between a feedback signal derived from the output of the PLL and a reference signal where the output of the PLL is the DCO output. The output of the phase detector is converted to a digital control word for input to the DCO. In response to the digital control word input, the DCO adjusts its output frequency accordingly. A feedback path formed between the DCO output and the phase detector input causes the PLL to adjust the DCO output frequency until the phase/frequency difference between the reference signal input and the feedback signal is within an acceptable limit. When this occurs, the PLL is said to be locked or synchronized to the reference signal input.

Non-monotonic regions in the DCO output response can increase the phase noise generated by the PLL. Increased phase noise may cause undesirable behavior by circuitry that receives a clock signal generated by the PLL. Particularly, if PLL lock occurs at or near a non-monotonic DCO operating region, PLL phase noise may increase due to unexpected behavior, such as sudden phase jump or the PLL running into a limited cycle when the DCO operates in such a region. A PLL is less likely to cleanly lock onto the phase or frequency of a reference signal input when different control word values input to the DCO cause duplicative regions in the DCO output response.

SUMMARY

According to the methods and apparatus taught herein, the control word input to a Digitally Controlled Oscillator (DCO) is modified to reduce non-monotonic regions in the output response of the DCO. By reducing non-monotonic regions in the DCO output response, performance of the DCO is improved. For example, the DCO may be included in a Phase-Locked Loop (PLL) circuit for generating an output signal that 'locks' onto either the phase or frequency of a reference input signal, thus synchronizing the output of the PLL with the reference signal. In such an application, PLL phase noise is lessened by modifying the control word input to the DCO to reduce non-monotonic regions in the output response of the DCO.

According to one embodiment, the output response of a DCO circuit is adjusted by modifying a control word input to the DCO circuit. The control word is modified to reduce one or more non-monotonic regions in the output response of the DCO circuit. When the modified control word is provided to the DCO circuit, it causes the DCO circuit to generate an output response having a monotonic behavior. The control word input to the DCO circuit may be modified by preventing control word values that correspond to non-monotonic regions from being input to the DCO. Alternatively, the control word input to the DCO may be modified by sorting control word values that correspond to non-monotonic regions so that values that cause similar DCO output response are successively ordered. The DCO circuit may further comprise circuitry for characterizing DCO operation. By characterizing DCO operation, non-monotonic regions in the output response of the DCO circuit may be identified.

According to one embodiment of a PLL, the PLL comprises a DCO, a phase error to digital word converter, characterization circuitry and control word modification circuitry. The DCO is configured to generate an output response corresponding to a control word input. The phase error to digital word converter is configured to convert the output response of the DCO to a digital representation while the PLL is configured in a characterization mode. The characterization circuitry is configured to vary the control word input over a range of values while the PLL is configured in the characterization mode and to measure the output response of the DCO over the range of control word input values based on the digital representation of the DCO output response generated by the phase error to digital word converter. The control word modification circuitry is configured to modify the control word input to the DCO based on the measured output response of the DCO while the PLL is configured in a functional mode.

The present invention is not limited to the above features and advantages. Those skilled in the art will recognize additional features and advantages upon reading the following detailed description, and upon viewing the accompanying drawings.

DETAILED DESCRIPTION

Figure 1:
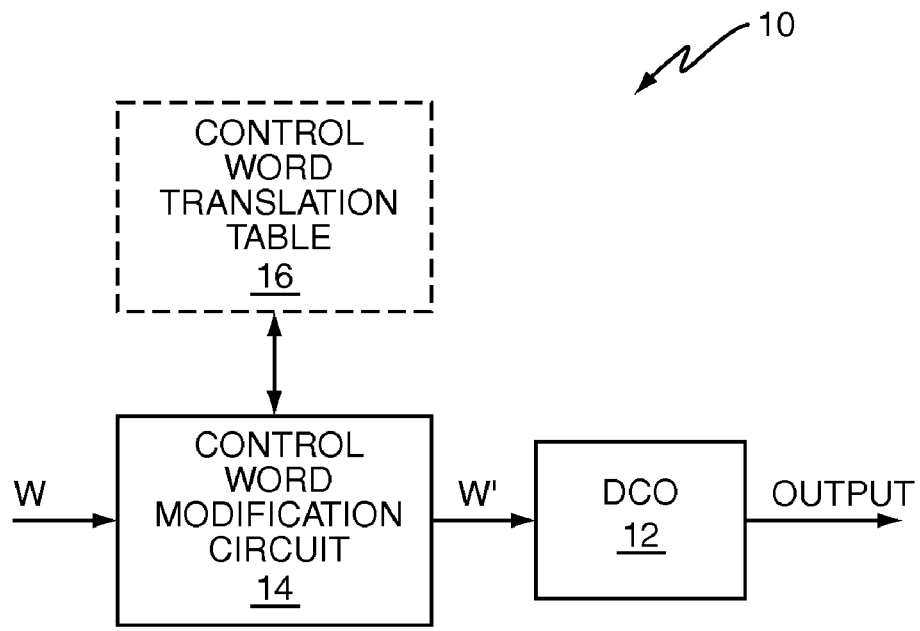
FIG. 1 is a block diagram of one embodiment of a Digitally Controlled Oscillator (DCO) circuit having circuitry for modifying the control word input to a DCO.
Figure 2:
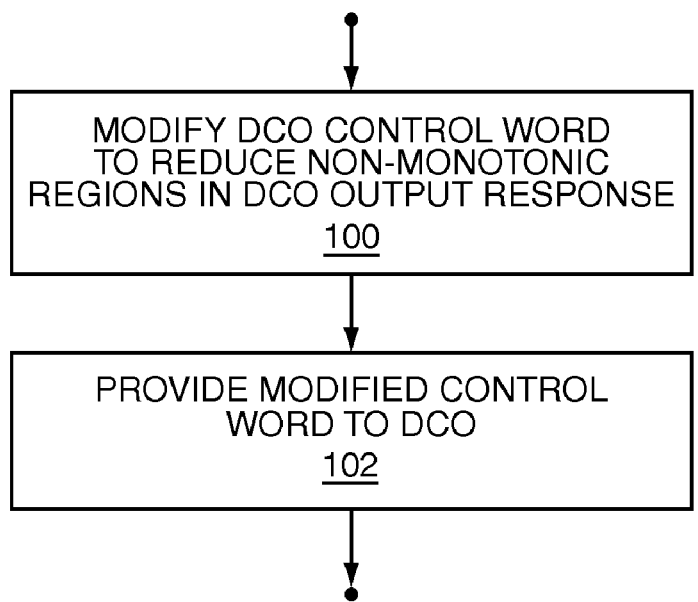
FIG. 2 illustrates one embodiment of processing logic for modifying the control word input to a DCO.
Figure 3:
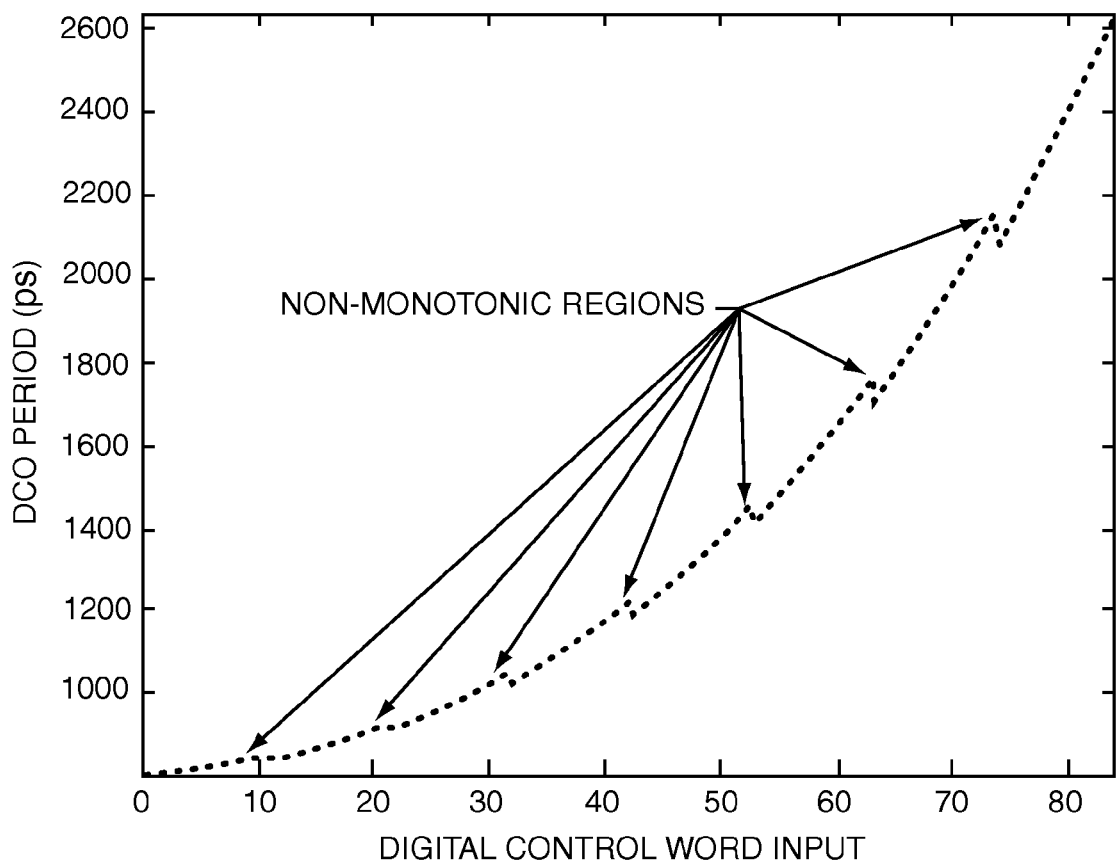
FIG. 3 is a plot diagram illustrating various non-monotonic regions in the output response of a DCO.

FIG. 1 illustrates an embodiment of a Digitally Controlled Oscillator (DCO) circuit 10 that includes a conventional DCO 12 and a control word modification circuit 14. The DCO 12 generates an output response corresponding to the particular value of a control word input. A control word modification circuit 14 included in or associated with the DCO circuit 10 modifies the control word input to the DCO 12 in order to reduce non-monotonic regions in the output response of the DCO 12, as illustrated by Step 100 of FIG. 2. The control word input to the DCO 12 may be modified until the non-monotonic operating regions in the output response of the DCO 12 are reduced to an acceptable level or eliminated. According to one embodiment, the control word modification circuit 14 accesses a table 16 included in or associated with the DCO circuit 10. The information stored in the table 16 identifies the control word values that cause non-monotonic behavior by the DCO 12, e.g., the control word values that cause the non-monotonic regions illustrated in FIG. 3. Using the information stored in the table 16, the control word modification circuit 14 reduces non-monotonic regions in the output response of the DCO by translating an unmodified control word (W) to a modified control word input (W'). The control word modification circuit 14 then provides the modified control word to the DCO 12 as illustrated by Step 102 of FIG. 2.

Figure 4:
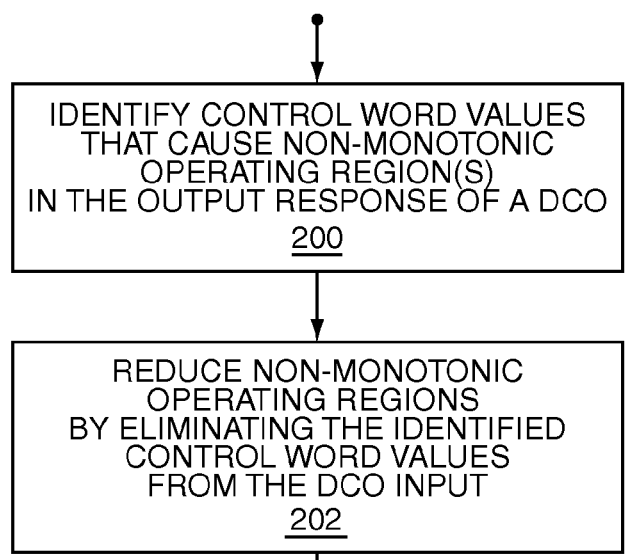
FIG. 4 illustrates another embodiment of processing logic for modifying the control word input to a DCO.

According to one embodiment, the control word modification circuit 14 reduces the non-monotonic regions in the output response of the DCO 12 by eliminating the offending values from the modified control word input. To that end, the control word modification circuit 14 accesses the information stored in the table 16 to identify those control word values that correspond to non-monotonic DCO operating regions, as illustrated in Step 200 of FIG. 4. One way of identifying problematic control word values is to step through all addresses in the table 16. Using FIG. 3 as an example, where an increasing output response function is expected, all addresses stored in the table 16 are examined one after another. Those addresses that yield a lower output as compared to any preceding address are identified, the identified addresses corresponding to non-monotonic regions in the output response of the DCO 12. The control word modification circuit 14 then prevents the identified control word values from passing to the control word input of the DCO 12, as illustrated in Step 202 of FIG. 4.

Figures 5, 6:
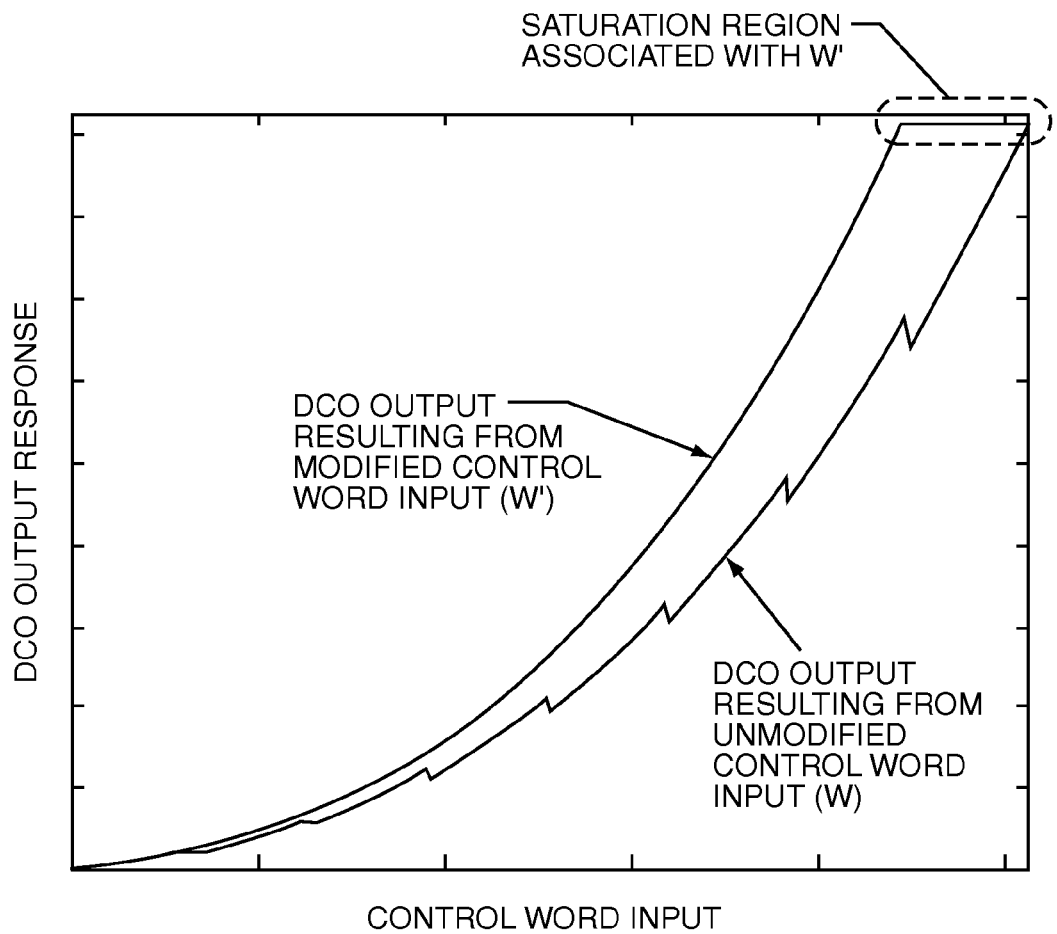
FIG. 5 is an exemplary illustration of modifying the control word input to a DCO according to the processing logic of FIG. 4.
FIG. 6 is an exemplary illustration of the output response of a DCO to a control word before and after the control word is modified in accordance with the processing logic of FIG. 4.

In a purely illustrative example, FIG. 5 illustrates an embodiment of a translation process employed by the control word modification circuit 14 for eliminating control word values from the DCO control word input. In this example, a four-bit unmodified control word input (W) is translated by the control word modification circuit 14 where the range of the unmodified control word is sixteen different values (range=$2^4$ values). The table 16 accessed by the control word modification circuit 14 identifies six control word values that correspond to three non-monotonic DCO operating regions (the $4^{th}$ and $5^{th}$ values, the $8^{th}$ and $9^{th}$ values, and the $12^{th}$ and $13^{th}$ values, respectively). Using this information, the control word modification circuit 14 is able to screen the identified values from the input (W') to the DCO 12. The control word modification circuit 14 screens control word values associated with non-monotonic DCO operating regions by translating successive unmodified control word values to respective modified control word values, skipping those values identified as being associated with non-monotonic DCO operating regions, e.g., as shown in FIG. 5. By translating unmodified control word values in this way, the order in which values are received by the control word modification circuit 14 is preserved while eliminating from the input to the DCO 12 those values associated with non-monotonic operating regions.

If one or more values are eliminated from the modified control word input, the control word modification circuit 14 may substitute a saturation value for those control word values that fall outside the range of the modified control word input. That is, when one or more values are screened from the DCO input, the modified control word input has a smaller range of values as compared to the unmodified control word. For example, as illustrated in FIG. 5, the modified control word has a range of ten different values (0-2, 5-6, 9-10, 13-15) while the unmodified control word has a range of sixteen different values (0-15). This is so because six values associated with non-monotonic DCO behavior have been eliminated from the modified control word. In one embodiment, the control word modification circuit 14 accounts for the reduced range of the modified control word by providing the greatest magnitude control word value to the DCO 12 for each received control word value that exceeds the reduced range of the modified control word. In effect, this creates a saturated region in the output response of the DCO 12 when an unmodified control word value falls outside the reduced range of the modified control word.

FIG. 6 illustrates the output response of the DCO 12 to the unmodified control word (W) and to the modified control word (W') as produced by the control word modification circuit 14. As shown in FIG. 6, various non-monotonic regions in the output response of the DCO 12 arise when the unmodified control word is not altered before being input to the DCO 12. Conversely, the non-monotonic regions are removed when the control word modification circuit 14 prevents the control word values associated with the non-monotonic regions from being input to the DCO 12. When the offending control word values are eliminated from the DCO input, a steadily increasing output devoid of duplicative regions is produced by the DCO 12. In addition, the control word modification circuit 14 sets a saturation region in the output response due to the reduced range of the modified control word input (W').

Figure 7:
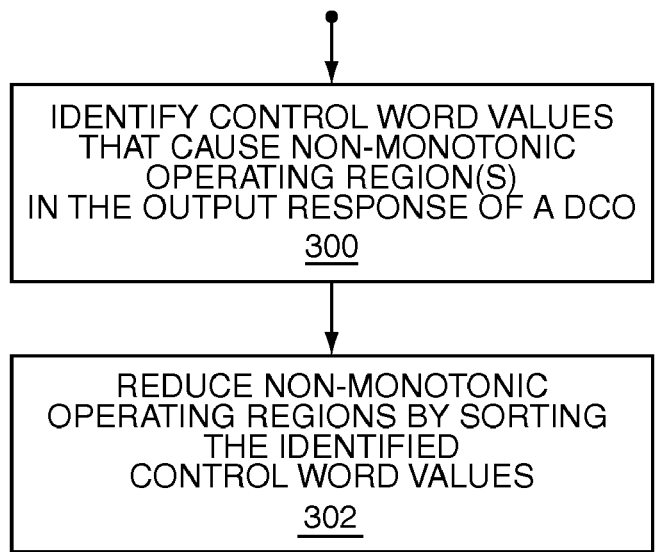
FIG. 7 illustrates yet another embodiment of processing logic for modifying the control word input to a DCO.

According to another embodiment for reducing non-monotonic DCO behavior, the control word modification circuit 14 sorts the offending values so that duplicative regions in the DCO output response are avoided. To that end, the control word modification circuit 14 uses the information stored in the table 16 to identify the control word values that cause non-monotonic DCO behavior, as illustrated in Step 300 of FIG. 7. One way of identifying problematic control word values is to step through all addresses in the table 16 and identify those that yield a lower output as compared to any preceding address, as previously described. The control word modification circuit 14 then sorts the identified control word values so that non-monotonic regions in the DCO output response are avoided when the reordered control word values are input to the DCO 12, as illustrated in Step 302 of FIG. 7. In one embodiment, control word values associated with non-monotonic regions are successively ordered. As such, duplicative regions in the DCO output response are removed.

Figure 8:
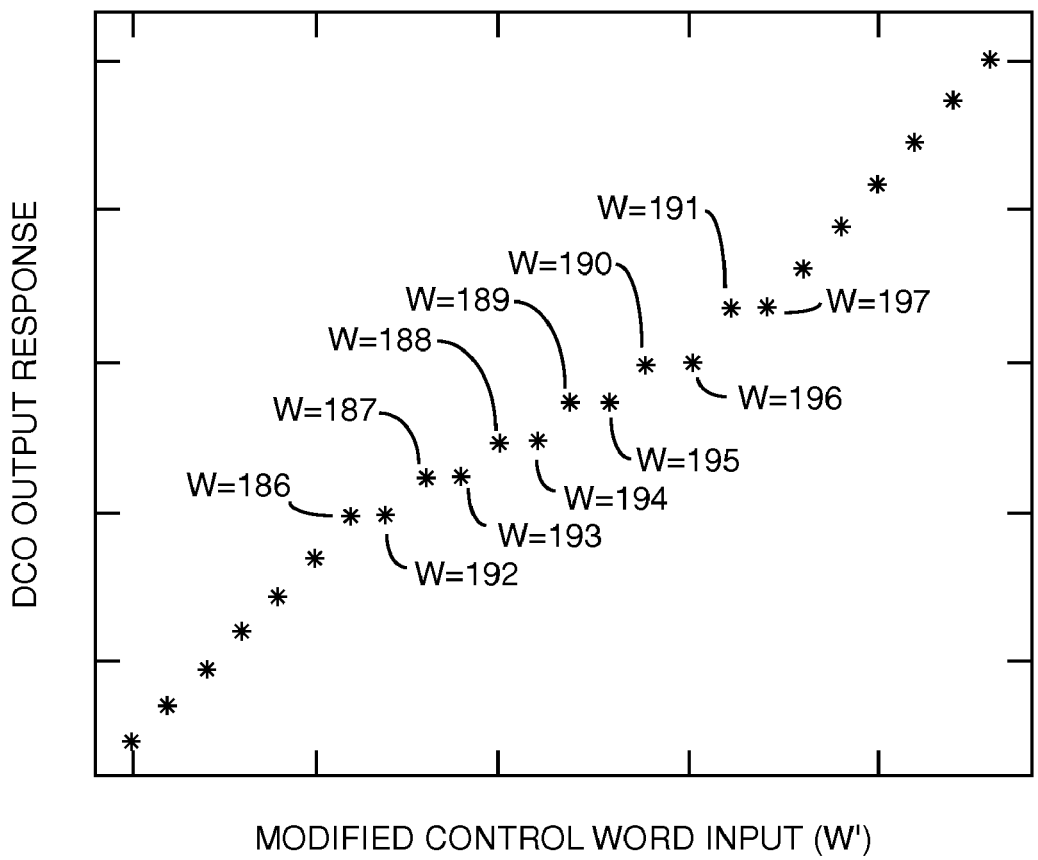
FIG. 8 is an exemplary illustration of the output response of a DCO to a control word modified in accordance with the processing logic of FIG. 7.

For illustrative purposes only, FIG. 8 illustrates how the control word modification circuit 14 removes the duplicative region of one non-monotonic DCO operating region by reordering the problematic control values (W=186 through 197). After identifying the offending values, the control word modification circuit 14 reorders the identified values, as illustrated in FIG. 8. The control word values associated with the non-monotonic DCO operating region (W=186 through 197) are reordered so that values that yield the same or similar DCO output response are arranged in successive order (e.g., W'= ... 186, 192, 187, 193, 188, 194, 189, 195, 190, 196, 191, 197 ... ).

Figure 9:
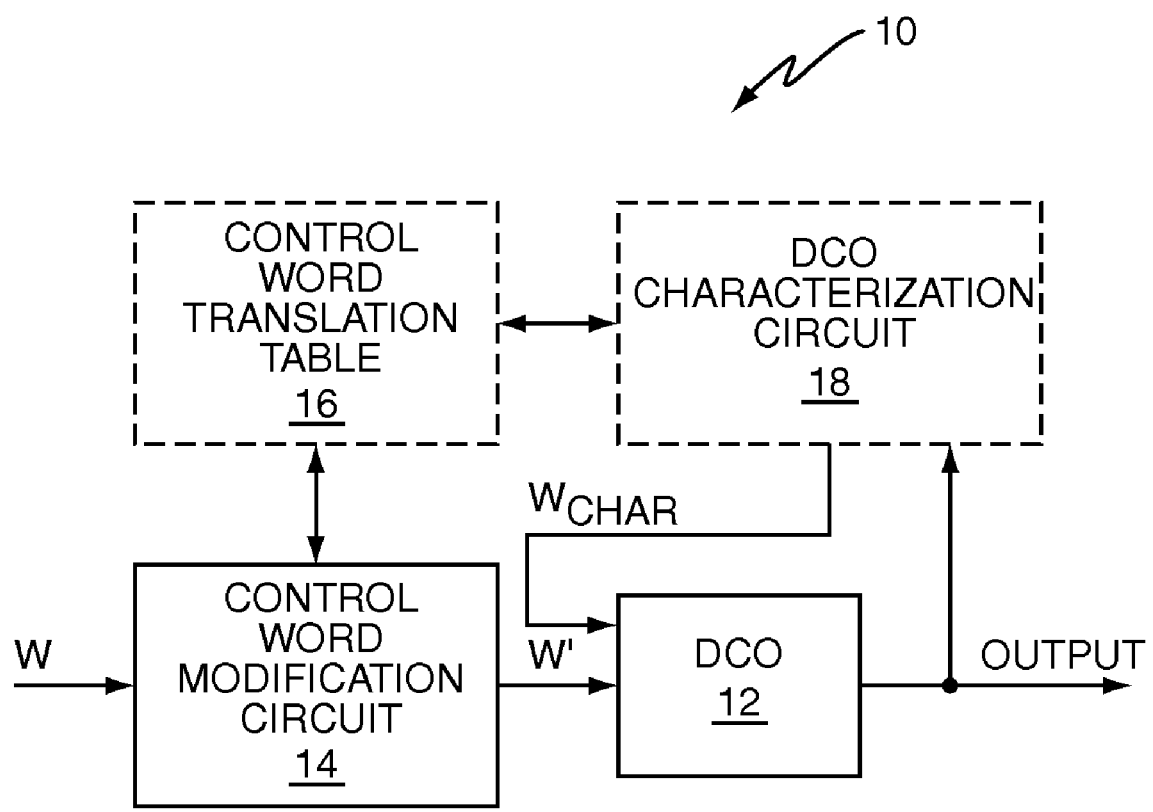
FIG. 9 is a block diagram of another embodiment of a DCO circuit having circuitry for modifying the control word input to a DCO and circuitry for characterizing operation of the DCO.
Figure 10:
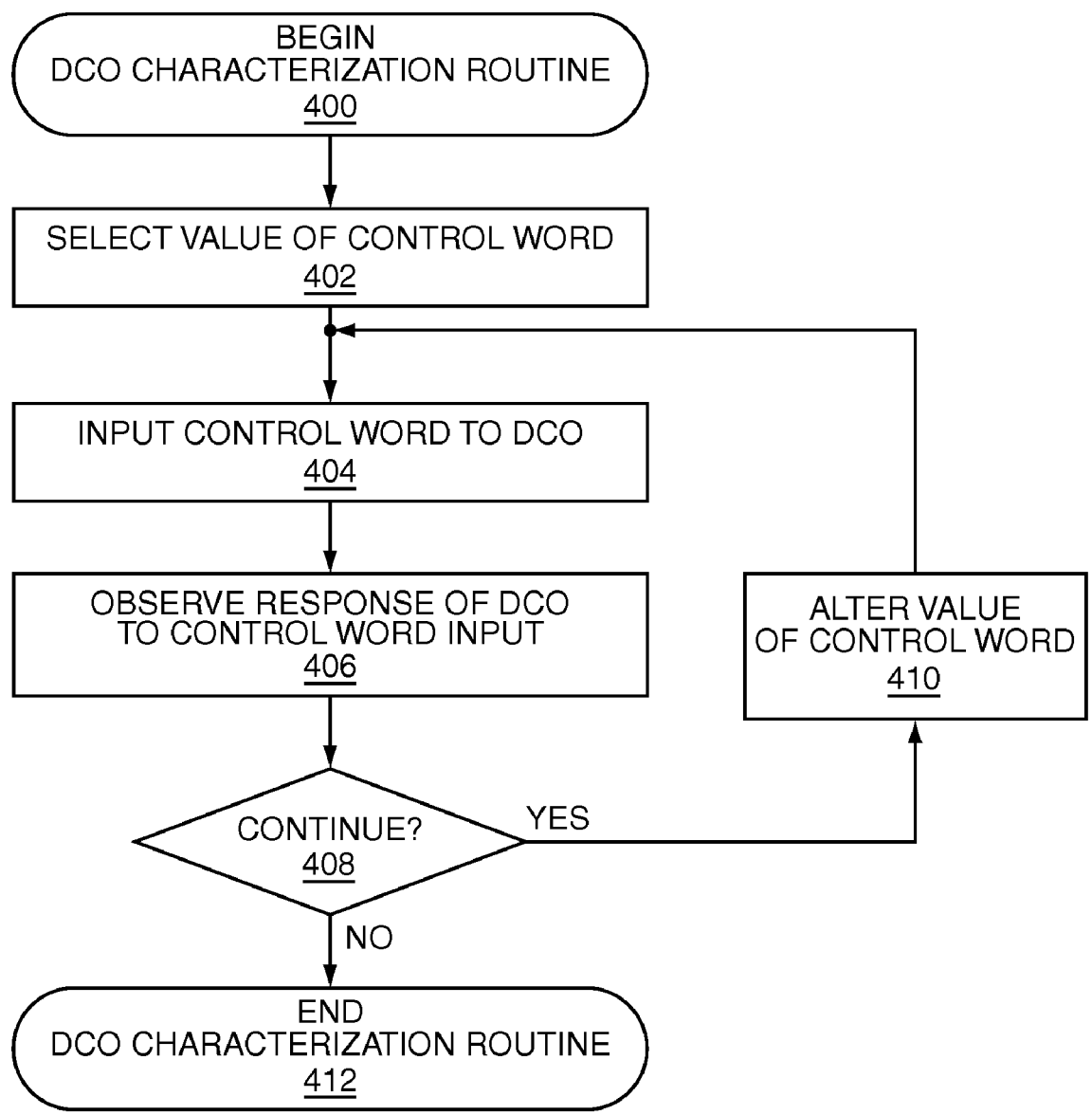
FIG. 10 illustrates an embodiment of processing logic for characterizing the output response of a DCO.

The information used by the control word modification circuit 14 to modify the input to the DCO 12 may be obtained during characterization of the DCO 12. FIG. 9 illustrates one embodiment of the DCO circuit 10 further including circuitry 18 for characterizing the output response of the DCO 12. The characterization circuitry 18 identifies non-monotonic regions in the DCO output response by providing a series of control word values to the DCO 12 and observing the corresponding response of the DCO 12. The characterization circuitry 18 initiates a DCO characterization routine when the DCO 12 is not in a normal functional operation mode, as illustrated by Step 400 of FIG. 10. For example, the DCO 12 may be characterized during a startup period for the DCO 12, while the DCO 12 is in an idle state, during a transition from the idle state to an active state or vice-versa. Regardless, the characterization circuitry 18 selects a first control word value ($W_{CHAR}$) for input to the DCO 12, as illustrated by Step 402 of FIG. 10. The selected control word value is then provided to the DCO 12, as illustrated by Step 404 of FIG. 10. The characterization circuitry 18 observes the response of the DCO 12 to the control word input, as illustrated by Step 406 of FIG. 10.

In one embodiment, the output response of the DCO 12 is observed for each control word value input to the DCO 12. The characterization process continues until all desired control word values have been input to the DCO 12 and the corresponding response observed, or until the process is aborted, as illustrated by Step 408 of FIG. 10. For example, the output response of the DCO 12 may be measured for each possible control word in the range of control word values available to the DCO 12. Alternatively, the output response may be measured for a subset of the entire range of possible control word values. Either way, if the characterization process continues, the characterization circuitry 18 alters the value of the control word input, e.g., by successively incrementing the value, as illustrated by Step 410 of FIG. 10. The process of providing a control word value to the DCO 12 and measuring its response continues (Steps 404 through 410 of FIG. 10). When the characterization routine ends or is aborted, the characterization circuitry 18 re-configures the DCO 12 for normal operation, as illustrated by Step 412 of FIG. 10.

The information measured during the DCO characterization process is arranged and stored in the table 16 for subsequent use by the control word modification unit 14 for reducing non-monotonic regions in the output response of the DCO 12 as previously described. That is, the measured output response information may be used by the control word modification circuit 14 to reduce non-monotonic regions in the output response of the DCO 12, e.g., as shown in FIGS. 6 and 8.

Figure 11:
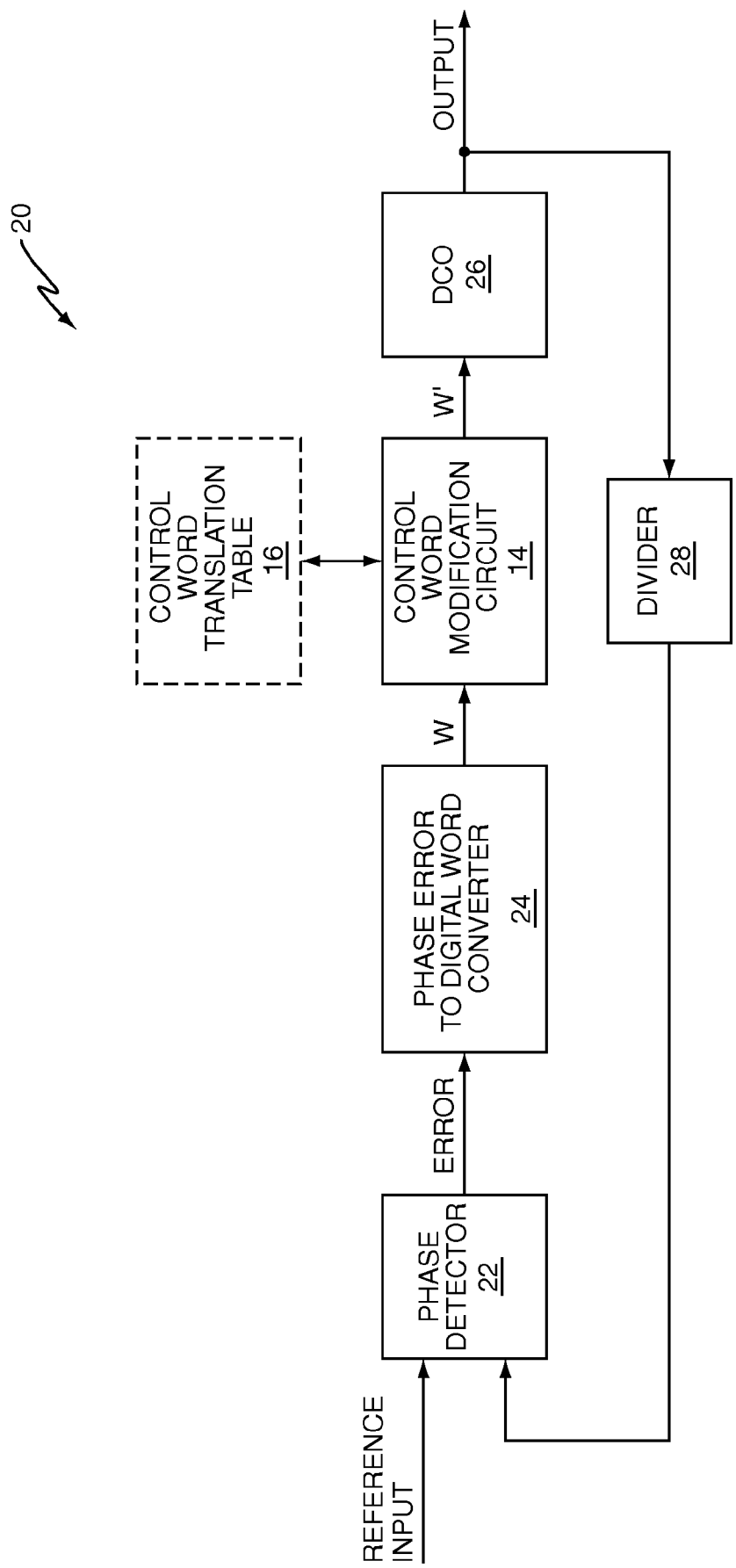
FIG. 11 is a block diagram of one embodiment of a Phase-Locked Loop (PLL) including circuitry for modifying the control word input to a DCO included in the PLL.

The various embodiments previously described herein utilize information gathered during characterization of the DCO 12 to modify the control word input to the DCO 12, e.g., by eliminating certain values from the DCO input or reordering them. The DCO circuit 10 may be included in various components, e.g., a Phase-Locked Loop (PLL). FIG. 11 illustrates one embodiment of a PLL 20 that generates an output signal that 'locks' onto either the phase or frequency of a reference input signal, thus synchronizing the output of the PLL 20 with the reference signal. To that end, the PLL 20 has a phase detector 22, a phase error to digital word converter 24, a DCO 26, a feedback path including an optional divider circuit 28 and a control word modification circuit 14 to provide a modified control word (W') to the DCO 26.

The phase detector 22, either digital or analog, produces an error signal corresponding to the phase difference between the feedback signal derived from the output of the DCO 26 and the reference signal input to the PLL 20. The phase error to digital word converter 24, e.g., a time-to-digital converter followed by an integrating digital filter or a charge pump, an analog filter followed by an analog to digital converter, converts the phase error signal generated by the phase detector 22 to a corresponding unmodified control word (W). The length of the unmodified control word limits the range of possible control word values, which in turn determines the tuning precision of the DCO 26. The magnitude of the unmodified control word determines the amount by which the DCO 26 adjusts its output response. The control word modification circuit 14 modifies the control word output by the phase error-to-digital word converter 24 as previously described. As such, non-monotonic regions in the output response of the DCO 26 are removed. Removing non-monotonic DCO behavior reduces the phase noise generated by the PLL 20 when the PLL 20 attempts to lock at or near a non-monotonic DCO operating region.

Figure 12:
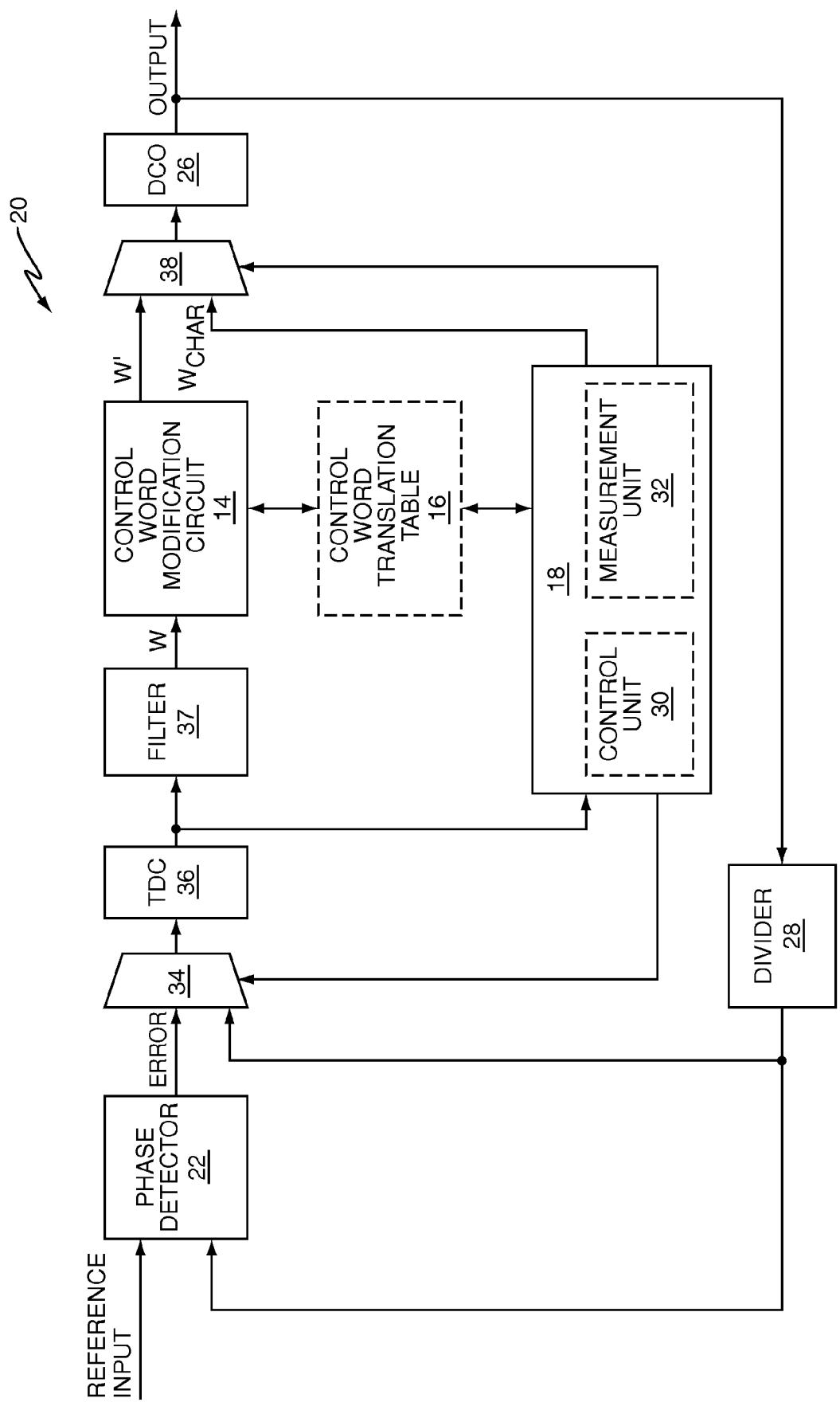
FIG. 12 is a block diagram of another embodiment of a PLL including circuitry for modifying the control word input to a DCO included in the PLL and circuitry for characterizing operation of the DCO.

FIG. 12 illustrates another embodiment of the PLL 20 where the PLL 20 further includes characterization circuitry 18 for characterizing the output response of the DCO 26. Particularly, the characterization circuitry 18 includes a control unit 30 and a measurement unit 32. The control unit 30 controls the flow of signals in the PLL 20 while the measurement unit 32 tracks the response of the DCO 26 to various control word values. As such, the response of the DCO 26 may be measured, thus providing information for identifying non-monotonic regions in the output response of the DCO 26.

During normal operation, e.g., when the PLL 20 generates a functional clock for synchronizing system operation, the control unit 30 enables normal signal flow within the PLL 20. In one embodiment, the control unit 30 directs a first multiplexer 34 to steer the output of the phase detector to a Time-to-Digital Converter (TDC) 36. The TDC 36 coverts pulse inputs, which represent the phase error signal generated by the phase detector 22, to a corresponding digital representation such as a count. Filter 37 converts the output of the TDC 36 to an unmodified control word (W). The control unit 30 also directs a second multiplexer 38 to pass the modified control word (W') output by the control word modification circuit 14 to the DCO 26. Hence, during normal operation, the PLL 20 attempts to lock onto a reference input signal by reducing the phase or frequency difference between the feedback signal derived from the output of the DCO 26 and the reference signal.

While the PLL 20 is not in a normal operation mode, the characterization circuitry 18 may measure the output response of the DCO 26 in order to populate the table 16. In more detail, the control unit 30 reconfigures the signal flow paths within the PLL 20 to enable characterization of the DCO 26. Particularly, the control unit 30 directs the second multiplexer 38 to pass a control word value selected by the measurement unit 32 to the DCO 26. In addition, the control unit 30 also directs the first multiplexer 34 to pass the output of the DCO 26 back to the TDC 36. As such, the TDC 36 provides a digital representation of the output signal generated by the DCO 26 instead of phase error. If the TDC 36 has sufficient resolution, the output of the DCO 26 may feedback directly to the TDC 36. However, if the resolution of the TDC 36 is not fine enough, the output of the DCO 26 may be passed through the optional divider circuit 28 before being directed to the TDC 36, as shown in FIG. 12. The optional divider circuit 28 reduces the output period of the DCO 26 by some rational number. As such, a low-resolution TDC 36 may be used to observe the reduced-period output response of the DCO 26 as generated by the divider circuit 28.

Regardless, the measurement unit 32 measures the output response of the DCO 26 as a function of control word input based on the output of the TDC 36. Thus, for each control word supplied to the DCO 26 by the characterization circuitry 18, the measurement unit 32 generates a corresponding response value. The measured output response information is arranged and stored in the table 16 for subsequent use by the control word modification circuit 14 in modifying the control word input to the DCO 26. The DCO characterization process continues until all desired control word values have been input to the DCO 26 and a corresponding response observed, or until the process is aborted. When the DCO characterization process ends or is aborted, the characterization circuitry 18 reconfigures the multiplexers 34, 38 to enable normal signal flow within the PLL 20. The DCO 26 may be characterized periodically or as often as desired to account for circuit degradation or varying operating conditions such as temperature.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A method of adjusting an output response of a digitally controlled oscillator (DCO) circuit, comprising:
   accessing a table storing control word translation information;
   translating individual control word values of a control word to respective modified control word values based on the control word translation information to reduce one or more non-monotonic regions in the output response of the DCO circuit; and
   providing the modified control word values to the DCO circuit.

2. The method of claim 1, wherein translating individual control word values to modified control word values comprises translating successive ones of the control word values to respective ones of the modified control word values, skipping the control word values that correspond to the one or more non-monotonic regions in the output response of the DCO circuit.

3. The method of claim 2, further comprising translating individual ones of the control word values that fall outside an initial range of the modified control word to a saturation value, the initial range of the modified control word corresponding to a set of the control word values that result in monotonic regions in the output response of the DCO circuit.

4. The method of claim 1, wherein translating individual control word values to modified control word values comprises translating successive ones of the control word values to respective ones of the modified control word values, reordering individual groups of the control word values that correspond to the one or more non-monotonic regions in the output response of the DCO circuit.

5. The method of claim 1, further comprising identifying the one or more non-monotonic regions in the output response of the DCO circuit.

6. The method of claim 5, wherein identifying the one or more non-monotonic regions in the output response of the DCO circuit comprises:
   measuring the output response of the DCO circuit over a range of control word values and
   identifying the control word values that correspond to the one or more non-monotonic regions in the output response.

7. The method of claim 6, wherein the range of control word values comprises a subset of the control word values available to the DCO circuit.

8. The method of claim 5, wherein identifying the one or more non-monotonic regions in the output response of the DCO circuit comprises periodically or as often as desired identifying non-monotonic regions in the output response of the DCO circuit.

9. The method of claim 5, wherein the non-monotonic regions in the output response of the DCO circuit are identified during at least one of a startup period for the DCO circuit, an idle state for the DCO circuit, a transition from the idle state to an active state, and a transition from the active state to the idle state.

10. An apparatus, comprising:
    a digitally controlled oscillator (DCO) circuit configured to generate an output response based on a control word input;
    a first circuit configured to store information identifying one or more non-monotonic regions in the output response of the DCO circuit; and
    a second circuit configured to modify the control word input to the DCO circuit based on the information stored by the first circuit.

11. The apparatus of claim 10, wherein the second circuit is configured to modify the control word input to the DCO circuit based on the information stored by the first circuit by translating control word values to modified control word values using the information stored by the first circuit.

12. The apparatus of claim 11, wherein the second circuit is configured to translate control word values to modified control word values using the information stored by the first circuit by translating successive ones of the control word values to respective ones of the modified control word values, skipping the control word values that correspond to the one or more non-monotonic regions in the output response of the DCO circuit.

13. The apparatus of claim 12, wherein the second circuit is further configured to translate individual ones of the control word values that fall outside an initial range of the modified control word to a saturation value using the information stored by the first circuit, the initial range of the modified control word corresponding to a set of the control word values that result in monotonic regions in the output response of the DCO circuit.

14. The apparatus of claim 11, wherein the second circuit is configured to translate control word values to modified control word values using the information stored by the first circuit by translating successive ones of the control word values to respective ones of the modified control word values, reordering individual groups of the control word values that correspond to the one or more non-monotonic regions in the output response of the DCO circuit.

15. The apparatus of claim 10, further comprising a third circuit configured to identify the one or more non-monotonic regions in the output response of the DCO circuit.

16. The apparatus of claim 15, wherein the third circuit is configured to identify the one or more non-monotonic regions in the output response of the DCO circuit by measuring the output response of the DCO circuit over a range of control word values and identifying the control word values that correspond to the one or more non-monotonic regions in the output response.

17. The apparatus of claim 15, wherein the range of control word values comprises a subset of the control word values available to the DCO circuit.

18. The apparatus of claim 15, wherein the third circuit is configured to identify the one or more non-monotonic regions in the output response of the DCO circuit by periodically or as often as desired identifying non-monotonic regions in the output response of the DCO circuit.

19. The apparatus of claim 15, wherein the third circuit is configured to identify the one or more non-monotonic regions in the output response of the DCO circuit during at least one of a startup period for the DCO circuit, an idle state for the DCO circuit, a transition from the idle state to an active state, and a transition from the active state to the idle state.

20. The apparatus of claim 10, wherein the first circuit comprises a table configured to store information identifying the one or more non-monotonic regions in the output response of the DCO circuit.

21. A phase-locked loop including the apparatus as claimed in claim 10.

22. A phase-locked loop (PLL) comprising:
a digitally controlled oscillator (DCO) configured to generate an output response corresponding to a control word input;
a phase error to digital word converter configured to convert the output response of the DCO to a digital representation while the PLL is configured in a characterization mode;
characterization circuitry configured to vary the control word input over a range of values while the PLL is configured in the characterization mode and to measure the output response of the DCO over the range of control word input values based on the digital representation of the DCO output response generated by the phase error to digital word converter; and control word modification circuitry configured to modify the control word input to the DCO based on the measured output response of the DCO while the PLL is configured in a functional mode.

23. The PLL of claim 22, wherein the control word modification circuitry is configured to modify the control word input to the DCO based on the measured output response of the DCO while the PLL is configured in a functional mode by translating control word values to modified control word values.

24. The PLL of claim 23, wherein the control word modification circuitry is configured to translate control word values to modified control word values by translating successive ones of the control word values to respective ones of the modified control word values, skipping the control word values that correspond to one or more non-monotonic regions in the measured output response of the DCO circuit.

25. The PLL of claim 24, wherein the control word modification circuitry is further configured to translate individual ones of the control word values that fall outside an initial range of the modified control word to a saturation value, the initial range of the modified control word corresponding to a set of the control word values that result in monotonic regions in the measured output response of the DCO circuit.

26. The PLL of claim 23, wherein the control word modification circuitry is configured to translate control word values to modified control word values by translating successive ones of the control word values to respective ones of the modified control word values, reordering individual groups of the control word values that correspond to one or more non-monotonic regions in the measured output response of the DCO circuit.

27. The PLL of claim 22, wherein the characterization circuitry is configured to measure the output response of the DCO over the range of control word input values based on the digital representation of the DCO output response generated by the phase error to digital word converter by associating individual ones of the control word input values with respective digital representations of the DCO output response.

28. The PLL of claim 22, wherein the phase error to digital word converter is configured to convert the output response of the DCO to a digital representation while the PLL is configured in a characterization mode by converting an output of a divider circuit configured to receive the output of the DCO.

* * * * *

UNITED STATES PATENT AND TRADEMARK OFFICE
CERTIFICATE OF CORRECTION

PATENT NO. : 7,715,515 B2 Page 1 of 1
APPLICATION NO. : 11/550907
DATED : May 11, 2010
INVENTOR(S) : Olsson et al.

It is certified that error appears in the above-identified patent and that said Letters Patent is hereby corrected as shown below:

On the title page, item (54), in Title, in Column 1, Line 2, delete "NON-MONTON1C" and insert -- NON-MONOTONIC --, therefor.

In Column 1, Line 2, delete "NON-MONTONIC" and insert -- NON-MONOTONIC --, therefor.

In Column 8, Line 13, in Claim 6, delete "values" and insert -- values; --, therefor.

In Column 9, Line 13, in Claim 17, delete "15," and insert -- 16, --, therefor.

Signed and Sealed this

Third Day of August, 2010

David J. Kappos
*Director of the United States Patent and Trademark Office*